(12) United States Patent
Wu

(10) Patent No.: US 6,184,069 B1
(45) Date of Patent: Feb. 6, 2001

(54) FABRICATION OF THIN FILM TRANSISTOR-LIQUID CRYSTAL DISPLAY WITH SELF-ALIGNED TRANSPARENT CONDUCTING LAYERS

(75) Inventor: Biing-Seng Wu, Jen Te (TW)

(73) Assignee: Chi Mei Electronics Corp., Taipei (TW)

( * ) Notice: Under 35 U.S.C. 154(b), the term of this patent shall be extended for 0 days.

(21) Appl. No.: 09/317,133

(22) Filed: May 24, 1999

(51) Int. Cl.$^7$ .................................................. H01L 21/00
(52) U.S. Cl. .................................................. 438/155
(58) Field of Search .................. 438/149, 151, 438/155, 158, 159, 160

(56) References Cited

U.S. PATENT DOCUMENTS 5,010,027 * 4/1991 Possin et al. ........................ 438/159
5,130,263 * 7/1992 Possin et al. ........................ 438/159
5,637,519 * 6/1997 Tsai et al. ............................ 438/160

* cited by examiner

Primary Examiner—Charles Bowers
Assistant Examiner—Keith Christianson

(57) ABSTRACT

A method of forming a TFT-LCD with self-aligned transparent conducting layer over a substrate comprises the following steps. Initially, a first metal layer is formed on the substrate. Then, an insulating layer is formed on the substrate. A silicon layer is formed above the insulator layer. A doped silicon layer is formed above the silicon layer. A second metal layer is formed on the doped silicon layer, the silicon layer, and the substrate to define S/D structures and data lines. Then, a passivation layer is formed on the second metal layer, the silicon layer, and the insulating layer. A transparent conducting layer is formed on the passivation layer. Then, a negative photoresist is formed on the transparent conducting layer. A front-side exposure step is performed by using a first photomask. Additionally, a back-side exposure step is performed by using the first metal layer and the second metal layer as a mask. After removing the unexposed negative photoresist, an etching step is performed to define the transparent conducting layer.

22 Claims, 4 Drawing Sheets

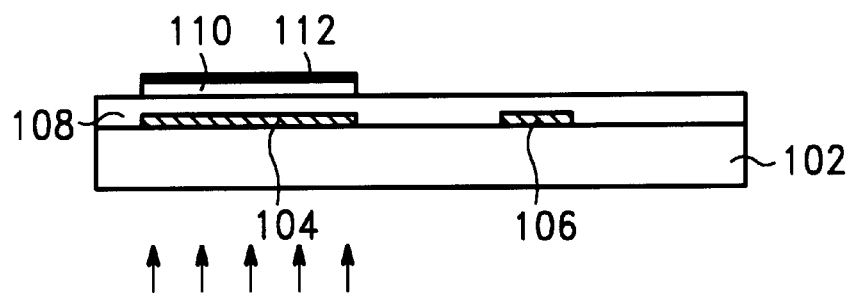
Fig.3A
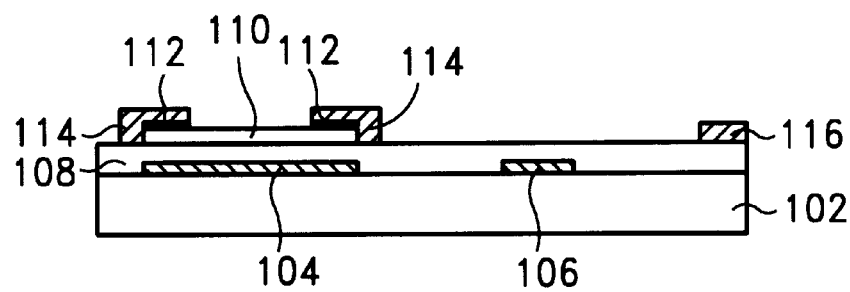
Fig.3B
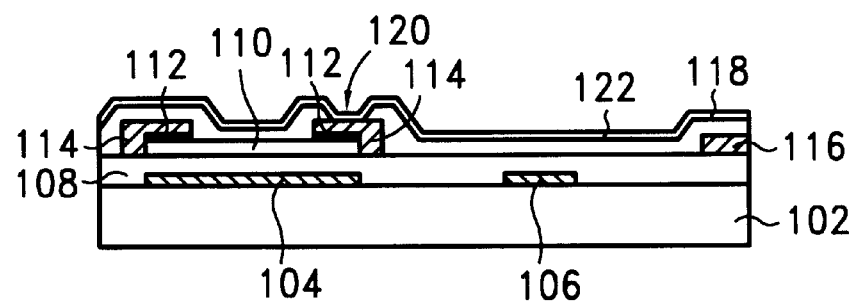
Fig.3C
Fig.3D

FABRICATION OF THIN FILM TRANSISTOR-LIQUID CRYSTAL DISPLAY WITH SELF-ALIGNED TRANSPARENT CONDUCTING LAYERS

FIELD OF THE INVENTION

The present invention relates to a process for manufacturing thin film transistor-liquid crystal displays and, more specifically, to a process for manufacturing thin film transistor-liquid crystal displays with self-aligned transparent conducting layers.

BACKGROUND OF THE INVENTION

Liquid crystal displays (LCD) are widely applied in electrical products, such as digital watches, calculators, etc. Moreover, with the advance of techniques for manufacture and design, the thin film transistor-liquid crystal display (TFT-LCD) is being introduced into portable computers, personal digital assistants, color televisions, and is replacing gradually the CRTS that are used for conventional displays. However, following the design rules of TFT-LCD to large scale devices, there are many problems and challenges, such as low yields and low throughput, in developing large scale TFT-LCDs devices.

In general, the TFT-LCD comprises a bottom plate on which is formed thin film transistors and pixel electrodes, and a top plate on which is constructed color filters. The liquid crystal molecules are filled between the top plate and the bottom plate. In their operation, a signal voltage is applied to the TFT that is the switching element of each unit pixel. The TFT receives the signal voltage, then turns on so that data voltage carrying image information can be applied to the corresponding pixel electrode and the liquid crystal via the TFT. The arrangement of the liquid crystal molecules is changed, thereby the optical properties are changed and the image is displayed.

The typical structure of the conventional TFT-LCD is illustrated in FIG. 1, wherein a gate 4 and a storage capacitor electrode 6 are formed on a substrate 2. An insulating layer 8 is formed on the substrate 2 to cover the gate 4 and the storage capacitor electrode 6. An a-silicon layer 10 is formed above the insulating layer 8 and the gate 4, and an n+ a-silicon layer 12 is deposited on the top surface of the a-silicon layer 10. In additional, source/drain (S/D) structures 14 are formed above the n+ a-silicon layer 12. It is noted that data lines 16 are also formed on the insulating layer 8 at the same time while the S/D structures 14 are defined. Moreover, a passivation layer 18 is formed on the substrate 2 to cover the S/D structures 14, the a-silicon layer 10 and the data lines 16. A contact hole 20 is formed on the passivation layer 18 to expose the surfaces of the S/D structures 14. An indium tin oxide (ITO) layer 22 is formed on the passivation layer 16 to connect the S/D structures 14 electrically.

It is noted that the ITO layer deposited on the passivation layer 18 is enlarged as much as possible, even overlaping the scan lines and data lines, for promoting the open ratio, as shown in FIG. 1, in order to increase the brightness of the TFT-LCD. However, the parasitic capacitor effect always occurs in the TFT-LCD structures due to the said overlapping, and causes interference between signals applied on the ITO electrodes and signals transferred from the adjacent data lines. A proposal to solve the issue is to form the TFT-LCD structure as illustrated in FIG. 2, wherein a portion of the ITO layer 22 is removed for preventing the residual ITO layer 22 from covering the data lines 16. However, the open ratio is reduced after removing the portion of the ITO layer 22. Thus, how to enlarge the area of the ITO electrode as much as possible and make the ITO electrode not overlap the scan lines and the data lines are current important issues.

SUMMARY OF THE INVENTION

The prime objective of the present invention is to provide a method for manufacturing a TFT-LCD display with self-aligned transparent conducting layers.

The second objective of the present invention is to provide a structure of TFT-LCD devices, wherein the edges of the transparent conducting layer are aligned to an edges of the data lines and the scan lines below.

The another objective of the present invention is to promote the open ratio of the transparent conducting layer in manufacturing the TFT-LCD devices.

The further objective of the present invention is to provide a method for manufacturing a TFT-LCD device using two exposure steps for reducing exposure defects.

A method for forming a TFT-LCD with a self-aligned transparent conducting layer over a substrate comprises the following steps. Initially, a first metal layer is formed on the substrate to define a gate structure, a scan line and a storage capacitor electrode on the substrate. Then, an insulating layer is formed on the first metal layer and the substrate. A silicon layer is formed above the insulator layer and the gate structure. A doped silicon layer is formed above the silicon layer, then a second metal layer is formed on said substrate to define S/D structures and data lines. Then, a passivation layer is formed on the second metal layer, a-silicon layer, and insulating layer, wherein the passivation layer has a contact hole for exposing the top surface of the S/D structure. A transparent conducting layer is formed on the passivation layer and the S/D structures.

Then, a negative photoresist is formed on the transparent conducting layer. A front-side exposure step is performed to pattern the negative photoresist by using a first photomask with openings corresponding to the contact hole and the storage capacitor electrode. Additionally, a back-side exposure step is performed by using the first metal layer and the second metal layer as the second photomask. After removing the unexposed negative photoresist, an etching step is performed to define a transparent conducting layer by using the residual negative photoresist. Thus, the edge of transparent conducting layer is aligned to the edge of data lines.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3A is a cross sectional view of a transparent substrate illustrating the steps of forming the gate structure and the storage capacitor electrode in accordance with the present invention;

FIG. 3B is a cross sectional view of a transparent substrate illustrating the steps of forming the insulating layer and a-silicon layer in accordance with the present invention;

FIG. 3C is a cross sectional view of a transparent substrate illustrating the steps of forming the S/D structures and the data lines in accordance with the present invention;

FIG. 3D is a cross sectional view of a transparent substrate illustrating the steps of forming the passivation layer and the transparent conducting layer in accordance with the present invention;

DETAILED DESCRIPTION OF THE PREFERRED EMBODIMENT

Figure 1:
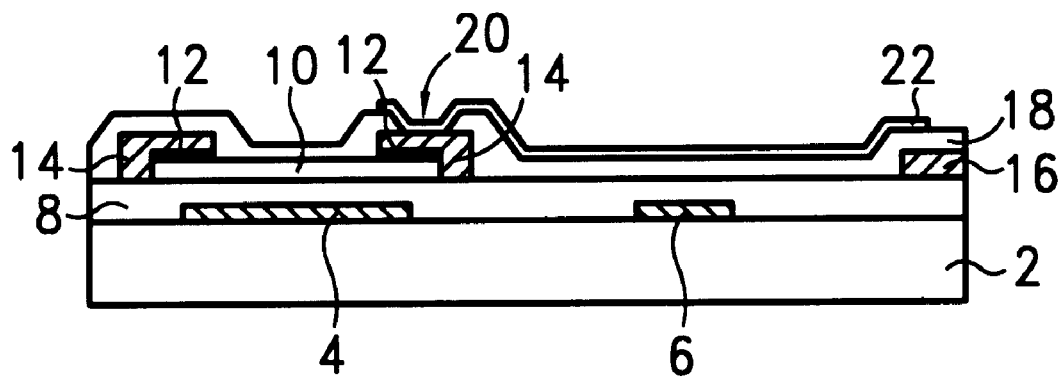
FIG. 1 is a cross sectional view of a transparent substrate illustrating the structure of TFT-LCD in accordance with the prior art.
Figure 2:
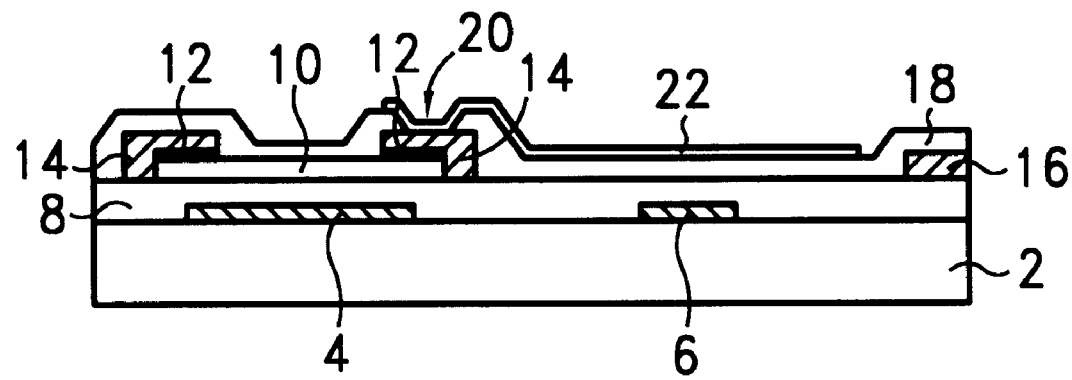
FIG. 2 is a cross sectional view of a transparent substrate illustrating the structure of TFT-LCD in accordance with the prior art.

A method is disclosed to manufacture the TFT-LCD with self-aligned transparent conducting layers, wherein a front-side exposure step and a back-side exposure step are used to define the patterns of the transparent conducting layers. The open ratio of the transparent conducting layer is promoted and the parasitic capacitor effect is diminished by using the method proposed in the present invention. Additionally, the exposure defects due to contaminant particles are also reduced effectively by performing two exposure steps. The following detailed description is an embodiment of the present invention by using the a-silicon TFT-LCD type structure. Accordingly, it will be appreciated that other similar process and modifications about using the negative photoresist and scan lines to define the ITO electrode by back-side exposure therein without departing from the spirit and scope of the invention.

Referring to FIG. 3A, in a preferred embodiment, glass, quartz, or the like is used as a transparent insulator substrate 102. Next, a first metal layer is formed on the substrate 102. The first metal layer is used to define the gate structure, the scan lines and the storage capacitors. Typically, the first metal layer can be chosen from the group of chromium(Cr), tungsten(W), titanium(Ti), tantalum(Ta), molybdenum(Mo), aluminum(Al), copper(Cu) and their alloys. In some cases, a multi-gate structure can also be used for the present invention. The material of the multi-gate structure can be selected from above material. Then, a lithography technique is used to pattern the first metal layer for defining a gate structure 104 and a storage capacitor electrode 106 on the substrate 102.

Referring to FIG. 3B, an insulating layer 108 is formed on the gate structure 104, the storage capacitor electrode 106, and the substrate 102 for serving as a gate insulator, wherein the insulating layer 108 can be chosen from the group of oxide, nitride, or oxynitride. The gate isolation is composed of silicon oxide or silicon nitride. In a preferred embodiment, a silicon oxide layer with a thickness about 3000 to 4000 angstroms can be formed by using plasma chemical vapor deposition method at about 330° C. The reaction gases for forming the silicon oxide or nitride layer can be $SiH_4$, $NH_3$, $N_2$, $N_2O$ or $SiH_2cl_2$, $NH_3$, $N_2$, and $N_2O$.

Next, an active layer 110 is deposited on the insulating layer 106 by using well-known technique, wherein the active layer 110 can be made of a-silicon. The active layer 110 with a thickness about 2000 to 3000 Angstroms is used to serve as the channel of TFT devices. Then, a contact layer 112 is formed on a top surface of the active layer 110 to serve as an interface between the active layer 110 and S/D structures formed later. In a preferred embodiment, a positive photoresist is formed first on the contact layer 112. Then, a back-side exposure indicated by arrows as shown in FIG. 3B is introduced using the gate structure 104 as a mask. The exposed portion of the positive photoresist is removed. Thus, only the portion over the gate structure 104 is left. An etching step is used to etch the contact layer 112 and the active layer 110 by using the positive photoresist left as a mask.

Then, referring to FIG. 3C, a second metal layer is formed above the contact layer 112, the active layer 110, and the insulating layer 108, in order to define the S/D structures and other conducting devices. Generally, the second metal layer can be chosen from the group of Cr, W, Ti, Ta, Mo, Al, Cu and their alloys. A lithography technique is performed to define the S/D structures 114 and data lines 116 on the second metal layer. The contact layer 112 is then etched to expose a top surface of the active layer 110 by using the S/D structures 114 as a mask.

Referring to FIG. 3D, a passivation layer 118 is formed on the second metal layer, the active layer 110, the contact layer 112 and the insulating layer 108. Namely, the passivation layer 118 is formed to cover the S/D structures 114 and the data lines 116. The passivation layer 118 can be chosen from the group of oxide, nitride, or oxynitride. In a preferred embodiment, an oxide layer with a thickness about 3000 to 4000 Angstroms can be formed by using chemical vapor deposition method at about 330° C. The reaction gases for forming the silicon oxide or nitride layer can be $SiH_4$, $NH_3$, $N_2$, $N_2O$ or $SiH_2cl_2$, $NH_3$, $N_2$, and $N_2O$. Then, an etching step is performed to form a contact hole 120 on the passivation layer 118 for exposing top surfaces of the S/D structures 114. A transparent conducting layer 122 is formed on the passivation layer 118 and the exposed top surfaces of the S/D structures 114, in order to connect the S/D structures 114 electrically. In a preferred embodiment, an indium tin oxide (ITO) layer with thickness about 200 to 800 Angstrom (for serving as the transparent conducting layer 122). is formed at temperature about 25° C. By performing a sputtering step.

Figure 4:
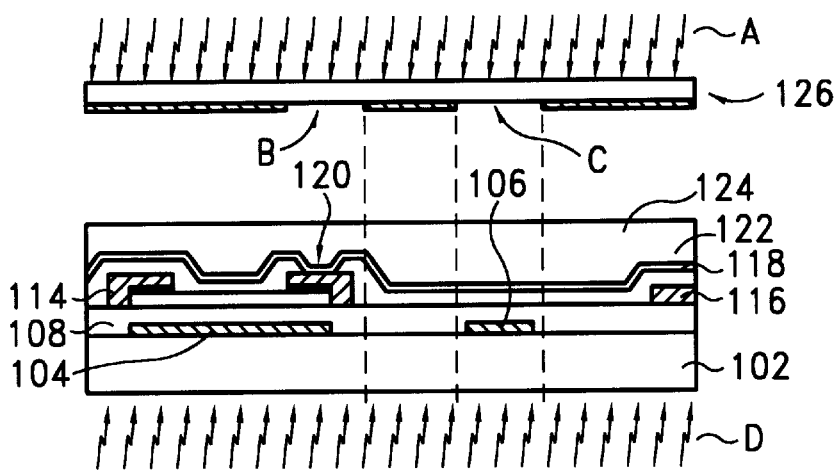
FIG. 4 is a cross sectional view of a transparent substrate illustrating the steps of performing the front-side exposure and the back-side exposure in accordance with the present invention.

Referring to FIG. 4, a negative photoresist 124 is formed on the transparent conducting layer 122. Then, a front-side exposure (illustrated by arrows A in FIG. 4) is performed to define the negative photoresist 124 by using a first photomask 126. It is noted that the first photomask has an opening B corresponding to the contact hole 120 and an opening C corresponding to the storage capacitor electrode 106. A back-side exposure (illustrated by arrows D in FIG. 4) is also performed to define the negative photoresist 124 by using the first metal layer (namely the gate structure 104 and the storage capacitor electrode 106) and the second metal layer (namely S/D structures 114 and data lines 116) as a second photomask. Alternatively, the two exposure procedures can be reversed, namely, the back-side exposure is done first, followed by performing the front-side exposure. Also the front-side exposure and the back-side exposure can be performed simultaneously.

Figure 5:
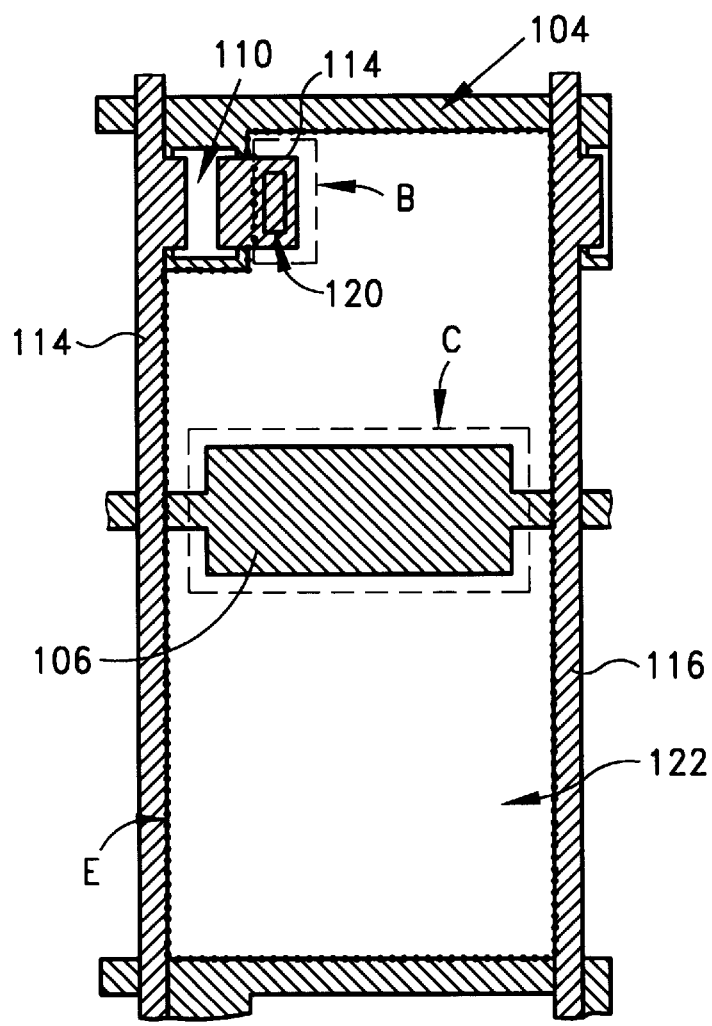
FIG. 5 is a top view of a transparent substrate illustrating the steps of performing the front-side exposure and the back-side exposure in accordance with the present invention.
Figure 6:
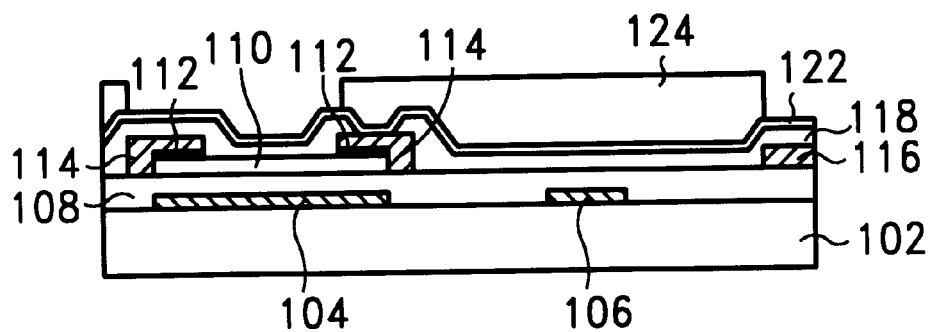
FIG. 6 is a cross sectional view of a transparent substrate illustrating the steps of defining the negative photoresist in accordance with the present invention.

Then, referring to FIG. 5, a top view of the substrate 102 is shown. As described above, the negative photoresist 124 is illuminated effectively in the back-side exposure but the regions of the gate structure 104, the storage capacitor electrode 106, S/D structures 114, and the data lines 116. Are not namely in region E, only the region covered by the storage capacitor electrode 106 is not illuminated. In addition, the regions of the negative photoresist 124 corresponding to the opening B (corresponsive to the contact hole 120) and the opening C (corresponsive to the storage capacitor electrode 106) are illuminated effectively in performing the front-side exposure. The negative photoresist 124 is patterned after removing the portions unexposed as shown in FIG. 6. It is noted that the edge of the patterned negative photoresist 124 is aligned to the edge of the data lines 116 after removing unexposed negative photoresist 124.

Figure 7:
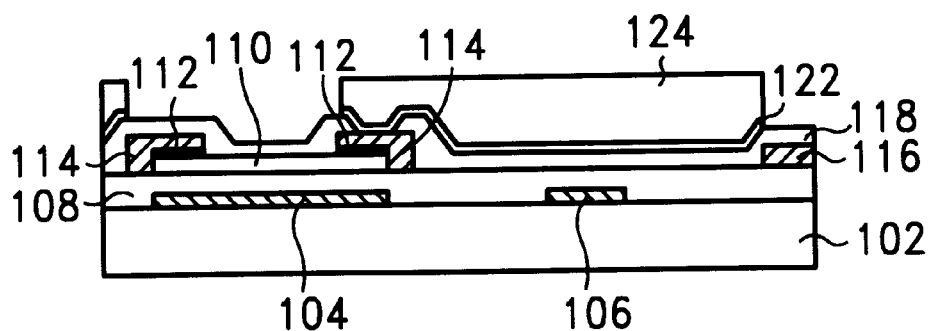
FIG. 7 is a cross sectional view of a transparent substrate illustrating the steps of defining the transparent conducting layer in accordance with the present invention.
Figure 8:
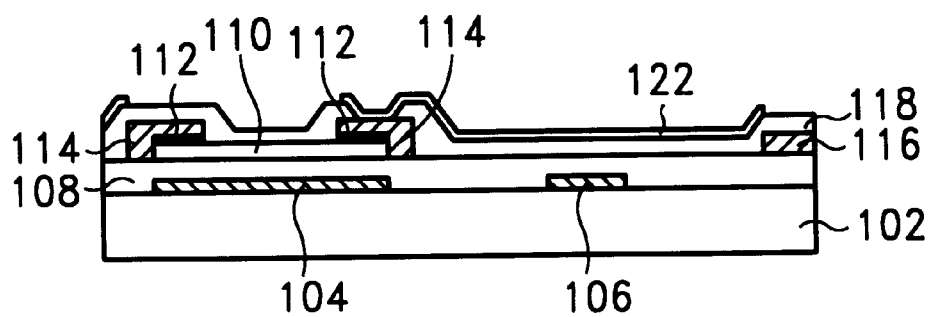
FIG. 8 is a cross sectional view of a transparent substrate illustrating the structure of a TFT-LCD device with self-aligned transparent conducting layers in accordance with the present invention.

Then, as shown in FIG. 7, an etching step is performed to etch the transparent conducting layer 122 by using the patterned negative photoresist 124 as an etching mask for removing the transparent conducting layer 122 exposed by the negative photoresist 124. After removing the residual negative photoresist 124, the structure of the TFT-LCD apparatus with self-aligned transparent conducting layer is shown as FIG. 8. It is noted that the patterned transparent conducting layer 122 does not overlap the data lines 116. The edge of the transparent conducting layer is aligned to the edge of the data lines 116 precisely. Thus, the parasitic capacitor effect occurring between the transparent conducting layer 122 and the data lines 116 is diminished effectively, and the open ratio of the transparent conducting layer 122 is optimized. In a preferred embodiment, the transparent conducting layer 122 is wet etched by using a mixed liquid of HCl and $HNO_3$ or a mixed liquid of HCl and $FeCl_2$.

The present invention can provide various benefits. First, the edge of the transparent conducting layer is aligned to the edge of the data lines precisely by using the first photomask to perform the front-side exposure and using the first metal layer and the second metal layer as the second photomask to perform the back-side exposure. Accordingly, the parasitic capacitor effect occurring between the transparent conducting layer and the data lines is diminished effectively, and the open ratio of the transparent conducting layer is optimized. Additionally, it is noted that the scales of the opening B and the opening C, as shown is FIG. 5, are not limited. In general, it is preferable to enlarge the regions of the opening B and the opening C as much as possible within the region E. Accordingly, the exposure defects occurring from the contaminant particles are reduced effectively by using the two exposure steps. Namely, even when there are contaminant particles on the first photomask causing unexposed defects, the back-side exposure still can be used to eliminate the unexposed defects. Similarly, when there are contaminant particles on the substrate causing unexposed defects, the front-side exposure by using the first photomask still can be used to eliminate the unexposed defects.

As is understood by a person skilled in the art, the foregoing preferred embodiment of the present invention is illustrative rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for defining the self-aligned transparent conducting layer of the thin film transistor-liquid crystal display (TFT-LCD) over a substrate, wherein a first metal layer is formed on said substrate to define the gate structure and the storage electrode, a second metal layer is formed above said substrate to define the source/drain structures, and said transparent conducting layer is formed above said first metal layer and said second metal layer, said method comprises the following steps of:

forming a negative photoresist on said transparent conducting layer;

performing a front-side exposure and a back-side exposure to define said negative photoresist, wherein said first metal layer and said second metal layer are used to be masks in said back-side exposure, a first mask with the openings corresponding to said source/drain structures and the storage electrode is used in said front-side exposure;

removing unexposed negative photoresist; and etching said transparent conducting layer for defining patterns on said transparent conducting layer by using said residual negative photoresist as a mask.

2. The method of claim 1, wherein said first metal layer is selected from the group consisting of Cr, W, Ta, Ti, Mo, Al and alloys thereof.

3. The method of claim 1, wherein said second metal layer is selected from the group consisting of Cr, W, Ta, Ti, Mo, Al and alloys thereof.

4. The method of claim 1, wherein said transparent conducting layer is formed of indium tin oxide (ITO).

5. The method of claim 1, wherein said transparent conducting layer is connected electrically to said source/drain structures through a contact hole, and said openings corresponding to said source/drain structures are also corresponding to said contact hole.

6. The method of claim 1, wherein an edge of said transparent conducting layer is aligned to an edge of the data lines after etching said transparent conducting layer.

7. A method of forming a thin film transistor-liquid crystal display (TFT-LCD) with self-aligned transparent conducting layers over a substrate, said method comprises the following steps of:

forming a first metal layer on said substrate to define a gate structure and a storage capacitor electrode;

forming an insulating layer on said first metal layer and said substrate;

forming an active layer on said insulating layer to cover said gate structure;

forming a contact layer on said active layer;

forming a second metal layer on said contact layer, said active layer, and said insulating layer for defining source/drain(S/D) structures;

forming a passivation layer on said second metal layer, said active layer and said insulating layer, wherein said passivation layer with a contact hole to expose a surface of said S/D structures;

forming a transparent conducting layer on said passivation layer and said surface of said S/D structures;

forming a negative photoresist on said transparent conducting layer;

performing a front-side exposure and a back-side exposure to define said negative photoresist;

removing unexposed negative photoresist; and etching said transparent conducting layer by using said residual negative photoresist as a mask.

8. The method of claim 7, wherein said first metal layer is selected from the group consisting of Cr, W, Ta, Ti, Mo, Al and alloys thereof.

9. The method of claim 7, wherein said insulating layer is selected from the group consisting of oxide, nitride and oxynitride.

10. The method of claim 7, wherein said active layer is formed of a-silicon.

11. The method of claim 7, wherein said contact layer is formed of doped silicon.

12. The method of claim 7, wherein said second metal layer is selected from the group consisting of Cr, W, Ta, Ti, Mo, Al and alloys thereof.

13. The method of claim 7, wherein said passivation layer is selected from the group consisting of oxide, nitride, oxynitride, and organic material.

14. The method of claim 7, wherein said transparent conducting layer is formed of indium tin oxide (ITO).

15. The method of claim 7, wherein a first mask with the openings corresponding to said source/drain structures and the storage electrode is used to serve as the photomask in said front-side exposure.

16. The method of claim 7, wherein said first metal layer and said second metal layer are used to be masks in said back-side exposure.

17. A method of forming a thin film transistor-liquid crystal display (TFT-LCD) with self-aligned transparent conducting layers over a substrate, said method comprises the following steps of:

forming a first metal layer on said substrate to define a gate structure and a storage capacitor electrode;

forming an insulating layer on said first metal layer and said substrate;

forming an a-silicon layer on said insulating layer to cover said gate structure;

forming a doped silicon layer on said a-silicon layer;

forming a second metal layer on said doped silicon layer, said a-silicon layer, and said insulating layer for defining source/drain(S/D) structures and data lines;

forming a passivation layer on said second metal layer, said a-silicon layer, and said insulating layer, wherein said passivation layer with a contact hole to expose a surface of said S/D structures;

forming a transparent conducting layer on said passivation layer and said surface of said S/D structures;

forming a negative photoresist on said transparent conducting layer;

performing a front-side exposure to define said negative photoresist by using a first photomask, and performing a back-side exposure by using said first metal layer and said second metal layer as a second photomask to define said negative photoresist, wherein said first photomask having openings corresponding to said contact hole and said storage capacitor electrode;

removing a portion of said negative photoresist; and etching said transparent conducting layer by using said residual negative photoresist as a mask, wherein an edge of said transparent conducting layer being aligned to an edge of said data lines.

18. The method of claim 17, wherein said first metal layer is selected from the group consisting of Cr, W, Ta, Ti, Mo, Al and alloys thereof.

19. The method of claim 17, wherein said second metal layer is selected from the group consisting of Cr, W, Ta, Ti, Mo, Al and alloys thereof.

20. The method of claim 17, wherein said insulating layer is selected from the group consisiting of oxide, nitride, oxynitride, and organic material.

21. The method of claim 17, wherein said passivation layer is selected from the group consisiting of oxide, nitride, oxynitride, and organic material.

22. The method of claim 17, wherein said transparent conducting layer is formed of indium tin oxide (ITO).

* * * * *